United States Patent
Chen

(10) Patent No.: US 6,177,319 B1
(45) Date of Patent: Jan. 23, 2001

(54) METHOD OF MANUFACTURING SALICIDE LAYER

(75) Inventor: Shu-Jen Chen, Hsinchu (TW)

(73) Assignee: United Microelectronics Corp., Hsinchu (TW)

( * ) Notice: Under 35 U.S.C. 154(b), the term of this patent shall be extended for 0 days.

(21) Appl. No.: 09/345,435

(22) Filed: Jul. 1, 1999

(30) Foreign Application Priority Data

Jan. 16, 1999 (TW) .................................................. 88100647

(51) Int. Cl.⁷ .............................................. H01L 21/8234
(52) U.S. Cl. .......................... 438/275; 438/279; 438/286; 438/592
(58) Field of Search .................................... 438/200, 229, 438/230, 275, 279, 286, 587, 588, 592, 649, 651

(56) References Cited

U.S. PATENT DOCUMENTS

| | | | |
|---|---|---|---|
| 5,539,256 | * | 7/1996 | Mikagi ................................. 257/763 |
| 5,792,684 | * | 8/1998 | Lee et al. .............................. 438/238 |
| 5,869,396 | * | 2/1999 | Pan et al. .............................. 438/647 |
| 5,891,785 | * | 4/1999 | Chang ................................... 438/592 |
| 6,001,721 | * | 12/1999 | Huang .................................. 438/597 |
| 6,004,843 | * | 12/1999 | Huang .................................. 438/241 |
| 6,015,748 | * | 1/2000 | Kim et al. ............................. 438/592 |

* cited by examiner

Primary Examiner—Charles Bowers
Assistant Examiner—Jack Chen
(74) Attorney, Agent, or Firm—Hickman Coleman & Hughes, LLP

(57) ABSTRACT

A method of manufacturing a salicide layer is described. A substrate having a memory region and a logic circuit region is provided, wherein the memory region comprises a first gate structure and a first source/drain region and the logic circuit region comprises a second gate structure and a second source/drain region. A first salicide layer is formed on the second gate structure and the second source/drain region in the logic circuit region. A dielectric layer is formed over the substrate. A portion of the dielectric layer is removed to expose the first gate structure and the first salicide layer above the second gate structure. A second salicide layer is formed on the first and the second gate structure.

20 Claims, 5 Drawing Sheets

METHOD OF MANUFACTURING SALICIDE LAYER

CROSS-REFERENCE TO RELATED APPLICATION

This application claims the priority benefit of Taiwan application serial no. 88100647, filed Jan. 16, 1999, the full disclosure of which is incorporated herein by reference.

BACKGROUND OF THE INVENTION

1. Field of the Invention

The present invention relates to a method of manufacturing a semiconductor device. In particular, the present invention relates to a method of manufacturing a salicide layer in an embedded structure.

2. Description of the Related Art

Typically, logic devices and memory devices are formed on the different wafers. In order to increase the efficiency of the integrated circuits (ICs), an embedded structure comprising a memory device region and a logic circuit region has been developed. The embedded structure has the benefit of decreasing production cost as well as improving the functional capacity of the devices. Integration improves functionality by lowering the time delay for sending signals from a memory device in one part of a semiconductor chip to a logic device in another part of another semiconductor chip. In addition, by putting memory and logic devices together on a semiconductor chip, cost of production is lowered because they can share most common fabrication procedures.

The most common embedded structure is an embedded dynamic random access memory (DRAM). The embedded DRAM comprises a logic circuit, a transfer field effect transistor (transfer FET) and a capacitor electrically coupled to the transfer FET. The transfer FET is used as a selectively coupled switch between a bottom electrode of the capacitor and a bit line. Hence, the data can be read from or stored in the capacitor.

FIGS. 1A through 1D are schematic, cross-sectional views of the conventional process for manufacturing a salicide layer in an embedded structure.

As shown in FIG. 1A, a substrate 100 having a memory region 102a and a logic circuit region 102b, which are isolated by an isolation region (not shown), is provided. A gate oxide layer 104 is formed over the substrate 100. A polysilicon layer 106 and a silicide layer 108 are formed over the substrate 100 in sequence.

As shown in FIG. 1B, the silicide layer 108, the polysilicon layer 106 and the gate oxide layer 104 are patterned to form gate oxide layers 104a and 104b, polysilicon layers 106a and 106b and silicide layers 108a and 108b. The gate oxide layer 104a, the polysilicon layer 106a and the silicide layer 108a together form a gate structure 110a. The gate oxide layer 104b, the polysilicon layer 106b and the silicide layer 108b together form a gate structure 110b. Source/drain regions 112a and 112b are formed in the substrate 100 by an implantation step and spacers 114a and 114b are respectively formed on the sidewalls of the gate structures 110a and 110b.

As shown in FIG. 1C, an oxide layer 116 is formed to cover the memory region 102a. A titanium layer 118 is formed over the substrate 100.

As shown in FIG. 1D, a portion of the titanium layer 118 over the source/drain region 112b is silicified by a thermal process to form a salicide layer 120. The remaining titanium layer 118 and the oxide layer 116 (as shown in FIG. 1C) are removed.

Conventionally, the silicide layers 108a and 108b formed on the polysilicon layers 106a and 106b are used to decrease the resistance of the gate structure. However, the implantation step used to form the source/drain regions 112a and 112b affects the structure of the silicide layers 108a and 108b while the implantation step is performed. Additionally, the annealing step used to uniform the ion distribution in the source/drain regions 112a and 112b and to decrease the stress of the source/drain regions 112a and 112b also affects the structure of the silicide layers 108a and 108b. Therefore, the resistance of the gate structure cannot be efficiently reduced and the reliability of the devices is poor.

The contact resistance of the gate structure and the source/drain can be efficiently reduced by forming the salicide layer on the gate structure and the source/drain. In the view of the logic circuit device, the operation rate can be increased by forming the salicide layer. But in the view of the memory device, the shallow junction of the source/drain region becomes thinner as the salicide layer is formed on the source/drain region, and thus serious leakage occurs at the capacitor electrically coupled to the source/drain region in the memory device.

SUMMARY OF THE INVENTION

The invention provides a method of manufacturing a salicide layer. By using the invention, the resistance of the gate structure can be reduced and the ability of the logic circuit device is enhanced.

To achieve these and other advantages and in accordance with the purpose of the invention, as embodied and broadly described herein, the invention provides a method of manufacturing a salicide layer. A substrate having a memory region and a logic circuit region is provided. The memory region comprises a first gate structure and a first source/drain region and the logic circuit region comprises a second gate structure and a second source/drain region. A protective layer is formed over the memory region. A first salicide layer is formed on the second gate structure and the second source/drain region in the logic circuit region. The protective layer is removed to expose the first gate structure and the first source/drain region. A dielectric layer is formed over the substrate. A portion of the dielectric layer is removed to expose the first gate structure and the first salicide layer above the second gate structure. A second salicide layer is formed on the first and the second gate structure. Since the formation of the first and the second salicide layer is performed after the first and the second source/drain region are formed in the substrate, the resistance of the gate structure can be efficiently reduced and the reliability of the devices is high. Additionally, because of the formation of the second salicide layer, the resistance of the first and the second gate structure is reduced and the ability of the logic circuit device is enhanced.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
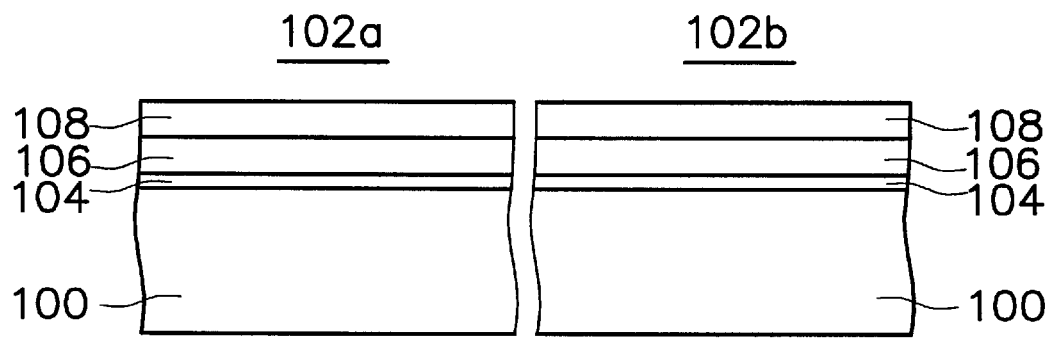
FIGS. 1A through 1D are schematic, cross-sectional views of the conventional process for manufacturing a salicide layer in an embedded structure.
Figure 1B:
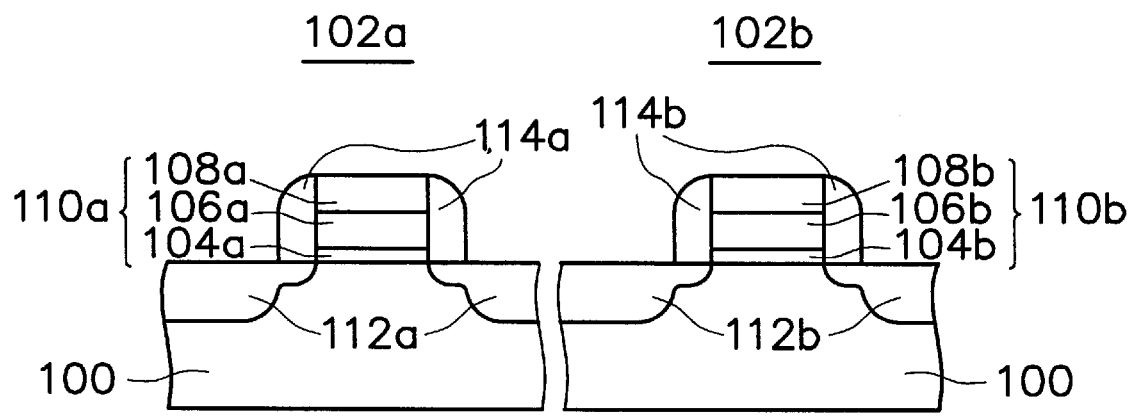
Figure 1C:
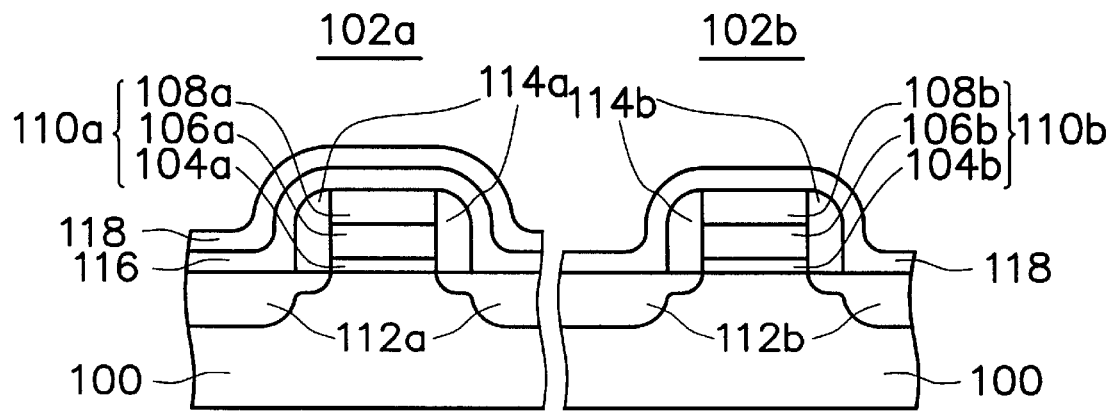
Figure 1D:
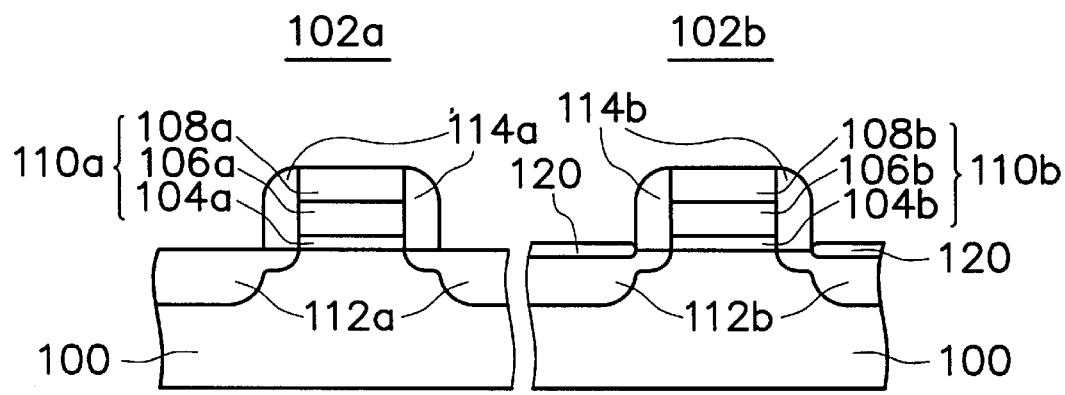

Reference will now be made in detail to the present preferred embodiments of the invention, examples of which are illustrated in the accompanying drawings. Wherever possible, the same reference numbers are used in the drawings and the description to refer to the same or like parts.

FIGS. 2A through 2H are schematic, cross-sectional views of the inventive process for manufacturing a salicide layer in an embedded structure.

Figure 2A:
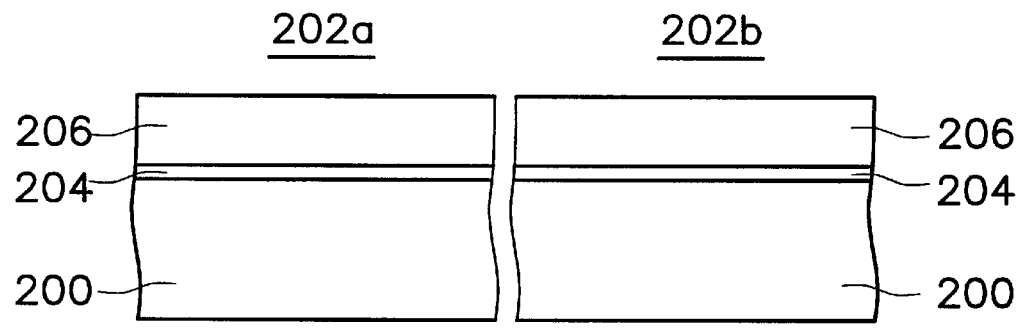
FIGS. 2A through 2H are schematic, cross-sectional views of the inventive process for manufacturing a salicide layer in an embedded structure.

As shown in FIG. 2A, a substrate 200 having a memory region 202a and a logic circuit region 202b, which are isolated by an isolation region (not shown), is provided. A gate oxide layer 204 is formed over the substrate 200. The gate oxide layer 204 can be formed by thermal oxidation, for example. A polysilicon layer 206 is formed on the gate oxide layer 204. The polysilicon layer can be a silicide layer, such as a tungsten silicon layer, for example.

Figure 2B:
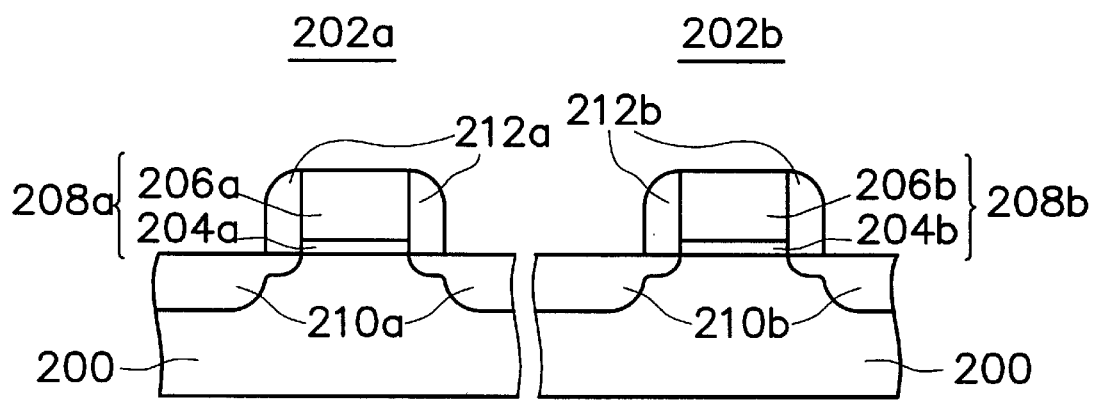

As shown in FIG. 2B, the polysilicon layer 206 and the gate oxide layer 204 are patterned to form gate oxide layers 204a and 204b and polysilicon layers 206a and 206b. The gate oxide layer 204a and the polysilicon layer 206a together form a gate structure 208a. The gate oxide layer 204b and the polysilicon layer 206b together form a gate structure 208b. Source/drain regions 210a and 210b are formed in the substrate 200 by an implantation step, and spacers 212a and 212b are respectively formed on the sidewalls of the gate structures 208a and 208b.

Figure 2C:
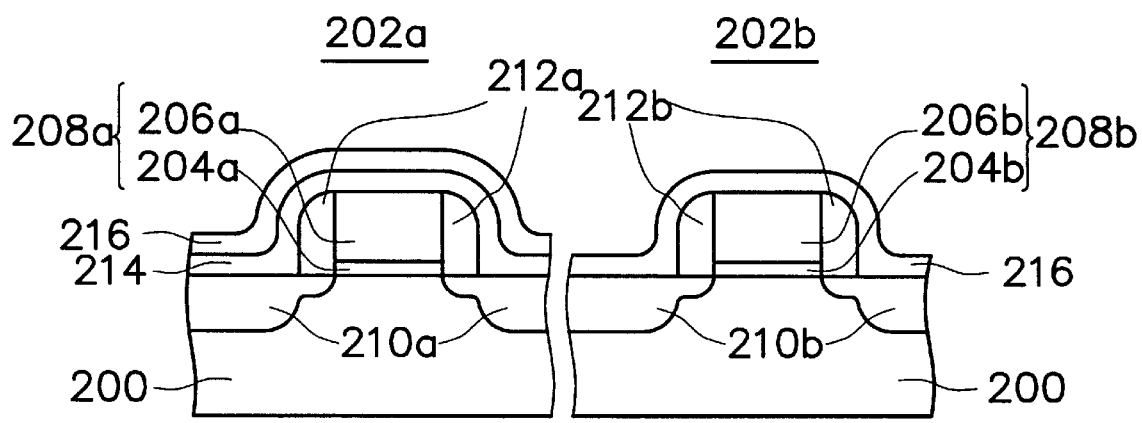

As shown in FIG. 2C, a protective layer 214 is formed to cover the memory region 202a and the logic circuit region 202b is exposed by the protective layer 214. The protective layer 214 can be a silicon oxide layer or a silicon nitride layer formed by chemical vapor deposition (CVD), for example. The protective layer 214 is used to protect the memory region 202a from the effect of the subsequent formation of the silicide layer over the logic circuit region. A metal layer 216 is formed on the protective layer 214 in the memory region 202a and is also formed on the gate structure 208b, the spacer 212b and the source/drain region 210b in the logic circuit region 202b. The metal layer 216 is formed from refractory metal by DC magnetron sputtering, for example. The refractory metal includes titanium, tungsten, cobalt, nickel, platinum and palladium, for example.

Figure 2D:
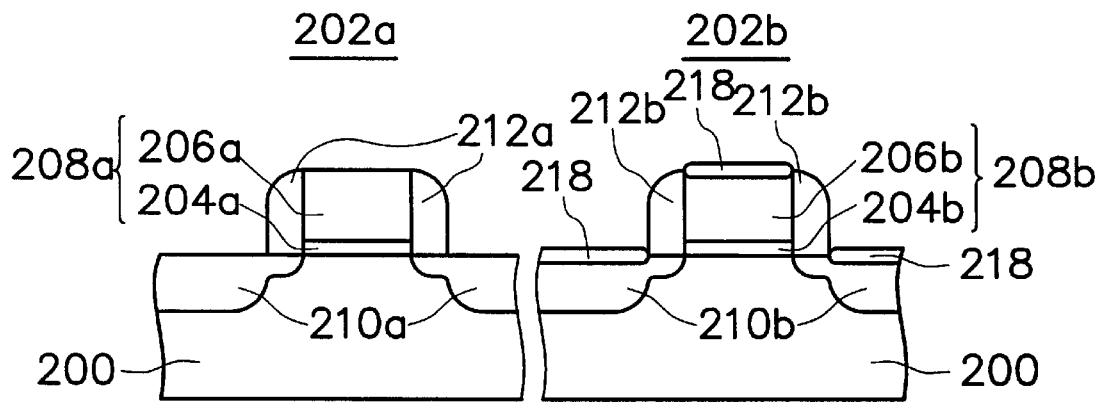

As shown in FIG. 2D, a thermal process is used to convert portions of the metal layer 216 above the gate structure 208b and the source/drain region 210b into a salicide layer 218. The salicide layer 218 can be a titanium nitride layer or a cobalt silicon layer, for example. The thermal process includes rapid thermal process (RTP), for example. The remaining metal layer 216, which is not converted into the salicide layer 218, is removed to expose the salicide layer 218, the spacer 212b and the protective layer 214. The method of removing the remaining metal layer 216 can be wet etching with RCA solution comprising ammonium, hydrogen peroxide and hot de-ionization water (HDIW), for example. The protective layer 214 is removed to expose the gate structure 208a, the spacer 212a and the source/drain region 210a in the memory region 202a.

Figure 2E:
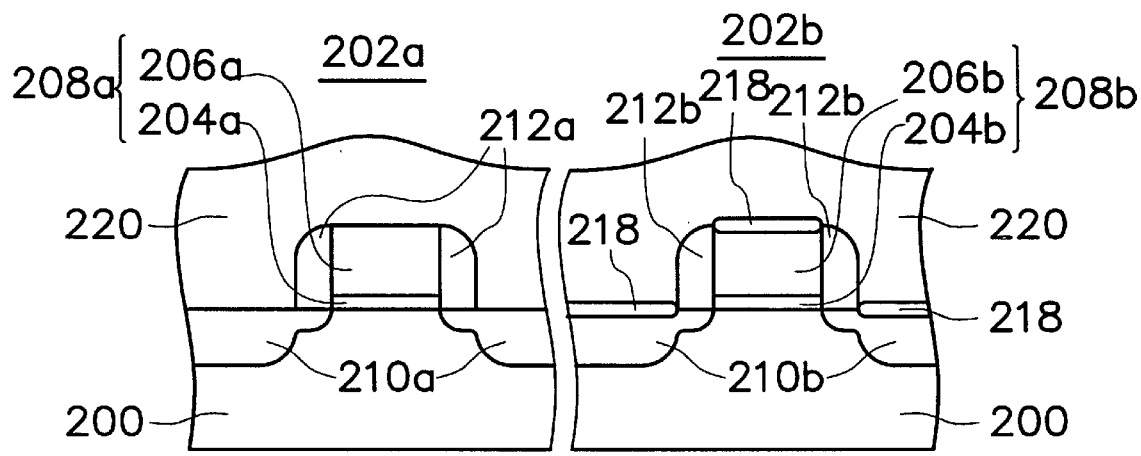

As shown in FIG. 2E, a dielectric layer 220 is formed on the gate structures 208a and 208b, the spacers 212a and 212b, the source/drain regions 210a and 210b, and the salicide layer 218. The dielectric layer 220 is thick enough to cover all devices in the memory region 202a and the logic circuit region 202b.

Figure 2F:
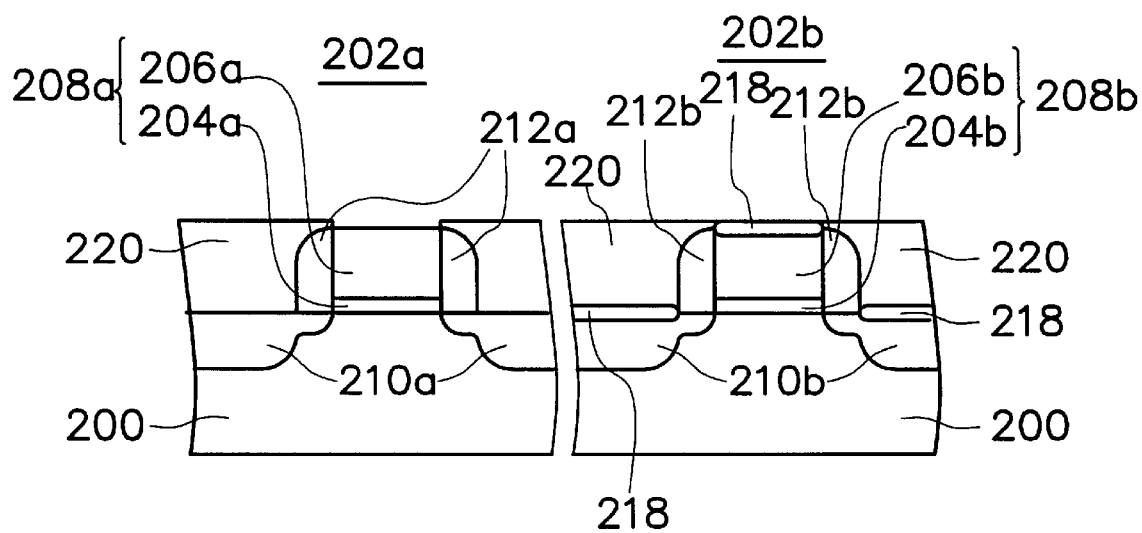

As shown in FIG. 2F, a portion of the dielectric layer 220 is removed to expose the top of the polysilicon layer 206a of the gate structure 208a and the top of the salicide layer 218 above the gate structure 208b. In this example, the salicide layer 218 above the gate structure 208b is used as an etching stop layer, and the method of removing the portion of the dielectric layer 220 comprises the steps of performing chemical-mechanical polishing (CMP), etching back or CMP incorporated with etching back to remove a portion of the dielectric layer 220 above the gate structures 208a and 208b until the salicide layer 218 above the gate structure 208b is exposed. A portion of the dielectric layer 220 is removed to expose the top of the polysilicon layer 206a of the gate structure 208a by dry etching. In the preferred embodiment, the gate structure 208b having the salicide layer 218 formed thereon that is higher than the gate structure 208a is used as an example. In application, the top surface of the gate structure 208b having the salicide layer 218 formed thereon can be level with or lower than that of the gate structure 208a.

In this example, when the gate structure 208a is level with the salicide layer 218 formed on the gate structure 208b, the method of removing the portion of the dielectric layer 220 comprises the step of performing CMP, etching back or the CMP incorporated with etching back to remove the portion of the dielectric layer 220 until the top surface of the polysilicon layer 206a of the gate structure 208a and the top surface of the salicide layer 218 above the gate structure 208b are exposed, substantially simultaneously. When the gate structure 208a is not level with the salicide layer 218 formed on the gate structure 208b, the method of removing the portion of the dielectric layer 220 comprises the steps of performing CMP, etching back or CMP incorporated with etching back to remove a portion of the dielectric layer 220 until the top of the higher one is exposed. Then, a dry etching step is performed to remove a portion of the dielectric layer 220 to expose the top of the lower one.

Figure 2G:
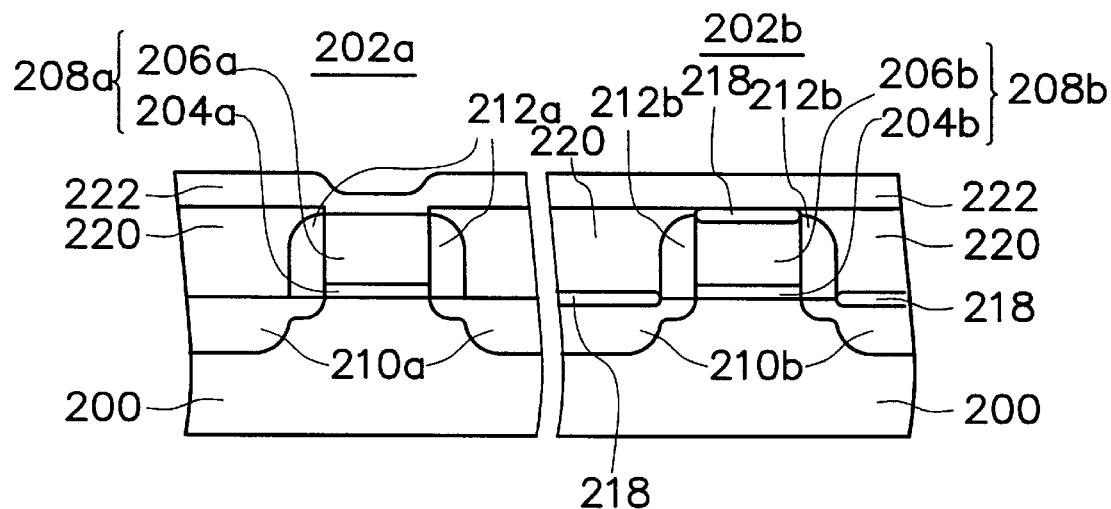

As shown in FIG. 2G, a metal layer 222 is formed on the dielectric layer 220, the gate structure 208a and the salicide layer 218 exposed by the dielectric layer 220. The metal layer 222 is made of refractory metal by DC magnetron sputtering, for example. The refractory metal includes titanium, tungsten, cobalt, nickel, platinum and palladium, for example.

Figure 2H:
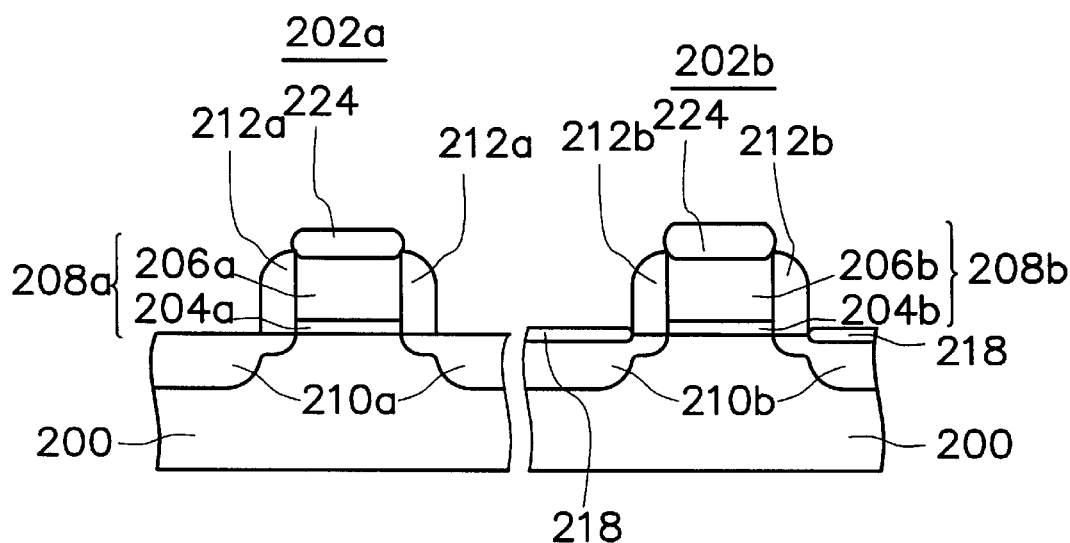

As shown in FIG. 2H, a thermal process is used to convert portions of the metal layer 222 above the gate structures 208a, 208b and the salicide layer 218 into a salicide layer 224. The salicide layer 218 on top of gate structure 208b can be combined with the salcide layer 224 in this process to form a single salicide layer on top of gate structure 208b. The salicide layer 224 can be a titanium nitride layer or a cobalt silicon layer, for example. The thermal process includes RTP, for example. The remaining metal layer 222, which is not converted into the salicide layer 224, is removed to expose the salicide layer 218, the spacers 212a and 212b and the source/drain regions 210a and 210b. The method of removing the remaining metal layer 222 can be wet etching with RCA solution comprising ammonium, hydrogen peroxide and hot de-ionized water (HDIW), for example. The dielectric layer 220 (as shown in FIG. 2G) is removed to expose the spacers 212a and 212b and the source/drain regions 210a and 210b.

Since the formation of the salicide layer 224 is performed after the source/drain regions 210a and 210b are formed in the substrate 200, the structure of the salicide layer 224 is not be affected by the implantation step used to form the source/drain regions 210a and 210b. Hence, the resistance of the gate structure can be efficiently reduced and the reliability of the devices is high. Additionally, because of the formation of the salicide layer 224 on the gate structures 208a and 208b, the resistance of the gate structures 208a and 208b is reduced and the ability of the logic circuit device is enhanced. Furthermore, the salicide layer 218 is formed on the source/drain region 210b, so that the sheet resistance of the source/drain region 210b is decreased and the operation rate of the device is increased.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of manufacturing a salicide layer suitable for formation on a substrate having a memory region and a logic circuit region, wherein the memory region comprises a first gate structure and a first source/drain region and the logic circuit region comprises a second gate structure and a second source/drain region, the method comprising the steps of:
    forming a protective layer over the memory region;
    forming a first salicide layer on the second gate structure and the second source/drain region in the logic circuit region after forming the protective layer over the memory region, whereby the first gate structure and the first source/drain region remain free from the first salicide layer;
    removing the protective layer to expose the first gate structure and the first source/drain region after forming the first salicide layer;
    forming a dielectric layer over the substrate;
    removing a portion of the dielectric layer to expose the first gate structure and the first salicide layer above the second gate structure; and
    forming a second salicide layer on the first gate structure and the second gate structure.

2. The method of claim 1, wherein the step of removing a portion of the dielectric layer includes chemical-mechanical polishing.

3. The method of claim 2, further comprising a step of performing a dry etching step to expose the first gate structure and the first salicide layer above the second gate structure after the chemical-mechanical polishing is performed.

4. The method of claim 1, wherein the step of removing a portion of the dielectric layer includes etching back.

5. The method of claim 4, further comprising a step of performing a dry etching step to expose the first gate structure and the first salicide layer above the second gate structure after the etching back is performed.

6. The method of claim 1, wherein the step of forming the first salicide layer further comprises the steps of:
    forming a first metal layer over the substrate;
    performing a first thermal process to convert portions of the first metal layer into the first salicide layer above the second gate structure and the second source/drain region; and
    removing the portion of the first metal layer that remains.

7. The method of claim 6, wherein the step of forming the first metal layer includes DC magnetron sputtering.

8. The method of claim 6, wherein the first thermal process includes rapid thermal process.

9. The method of claim 1, wherein the step of forming the second salicide layer further comprises the steps of:
    forming a second metal layer over the substrate;
    performing a second thermal process to convert portions of the second metal layer into the second salicide layer above the first gate structure and the second gate structure; and
    removing the portion of the second metal layer that remains.

10. The method of claim 9, wherein the step of forming the second metal layer includes DC magnetron sputtering.

11. The method of claim 9, wherein the second thermal process includes rapid thermal process.

12. A method of manufacturing a salicide layer suitable for formation on a substrate having a memory region and a logic circuit region, wherein the memory region comprises a first gate structure and a first source/drain region and the logic circuit region comprises a second gate structure and a second source/drain region, the method comprising the steps of:
    forming a first salicide layer on the second gate structure and the second source/drain region in the logic circuit region, whereby the first gate structure and the first source/drain region remain free from the first salicide layer;
    forming a dielectric layer over the substrate;
    removing a portion of the dielectric layer to expose the first gate structure and the first salicide layer above the second gate structure; and
    forming a second salicide layer on the first gate structure and the second gate structure.

13. The method of claim 12, wherein the step of forming the first salicide layer further comprises the steps of:
    forming a first metal layer over the substrate;
    performing a first thermal process to convert portions of the first metal layer into the first salicide layer above the second gate structure and the second source/drain region; and
    removing the portion of the first metal layer that remains.

14. The method of claim 13, wherein the step of forming the first metal layer includes DC magnetron sputtering.

15. The method of claim 13, wherein the first thermal process includes a rapid thermal process.

16. The method of claim 12, wherein the step of forming the second salicide layer further comprises the steps of:
    forming a second metal layer over the substrate;
    performing a second thermal process to convert portions of the second metal layer into the second salicide layer above the first gate structure and the second gate structure; and
    removing the portion of the second metal layer that remains.

17. The method of claim 16, wherein the step of forming the second metal layer includes DC magnetron sputtering.

18. The method of claim 16, wherein the second thermal process includes rapid thermal process.

19. The method of claim 16, wherein the step of removing a portion of the dielectric layer includes chemical-mechanical polishing.

20. The method of claim 16, wherein the step of removing a portion of the dielectric layer includes etching back.

* * * * *